US008621401B2

(12) United States Patent
Berkens et al.

(10) Patent No.: US 8,621,401 B2
(45) Date of Patent: Dec. 31, 2013

(54) METHOD OF SELECTING A SET OF ILLUMINATION CONDITIONS OF A LITHOGRAPHIC APPARATUS FOR OPTIMIZING AN INTEGRATED CIRCUIT PHYSICAL LAYOUT

(75) Inventors: Martinus Maria Berkens, Eindhoven (NL); Anurag Mittal, South Riding, CA (US)

(73) Assignee: Takumi Technology Corporation, Santa Clara, CA (US)

( * ) Notice: Subject to any disclaimer, the term of this patent is extended or adjusted under 35 U.S.C. 154(b) by 0 days.

(21) Appl. No.: 13/143,794

(22) PCT Filed: Jan. 8, 2010

(86) PCT No.: PCT/NL2010/050004
§ 371 (c)(1),
(2), (4) Date: Oct. 26, 2011

(87) PCT Pub. No.: WO2010/080028
PCT Pub. Date: Jul. 15, 2010

(65) Prior Publication Data
US 2012/0042290 A1    Feb. 16, 2012

(30) Foreign Application Priority Data
Jan. 9, 2009   (EP) .................................... 09150298

(51) Int. Cl.
*G06F 17/50*   (2006.01)
(52) U.S. Cl.
USPC .................................. 716/54; 716/55; 716/56
(58) Field of Classification Search
USPC ...................................................... 716/54–56
See application file for complete search history.

(56) References Cited

U.S. PATENT DOCUMENTS

| | | | | |
|---|---|---|---|---|
| 5,965,309 A * | 10/1999 | Ausschnitt et al. | ............. | 430/30 |
| 6,519,501 B2 * | 2/2003 | Pierrat et al. | ................. | 700/121 |
| 6,632,692 B1 * | 10/2003 | Hewett et al. | ................... | 438/18 |
| 6,738,954 B1 * | 5/2004 | Allen et al. | ...................... | 716/56 |
| 6,871,337 B2 * | 3/2005 | Socha | ............................. | 716/54 |
| 7,030,966 B2 | 4/2006 | Hansen | | |

(Continued)

OTHER PUBLICATIONS

International Search Report from WO 2010/080028, mailed Sep. 14, 2010.

*Primary Examiner* — Naum Levin
(74) *Attorney, Agent, or Firm* — Swanson & Bratschun, L.L.C.

(57) ABSTRACT

The invention relates to a method of selecting a set of illumination conditions of a lithographic apparatus, in a process for transferring an integrated circuit layout to a target substrate. The layout is comprised of a number of polygon patterns having a predetermined geometrical relation relative to each other. An initial set of illumination conditions is provided and a plurality of polygon patterns requiring illumination conditions critical for circuit functionality. For the initial set of illumination conditions a local cost number is calculated, defining a difference measure of at least one critical dimension, between the polygon pattern and a transferred polygon pattern as a function of illumination condition. For each polygon pattern the cost numbers are aggregated; and the illumination conditions are varied so as to select an optimal set of illumination conditions having an optimized aggregated cost number. Polygon patterns are identified as predefined complex circuit elements and wherein the cost numbers are expressed as circuit element cost number functions that are individually associated with said identified complex circuit elements, so as to express circuit design intent. The cost number functions can further have interdependencies in multiple critical dimensions of the polygon patterns so as to take the two dimensional nature into account.

11 Claims, 10 Drawing Sheets

(56) References Cited

U.S. PATENT DOCUMENTS

| | | |
|---|---|---|
| 7,245,356 B2 | 7/2007 | Hansen |
| 7,713,889 B2 * | 5/2010 | Hirukawa ................ 438/800 |
| 7,855,037 B2 * | 12/2010 | Kim ................................ 430/5 |
| 2002/0122994 A1 | 9/2002 | Cote |
| 2004/0156029 A1 | 8/2004 | Hansen |
| 2004/0184030 A1 | 9/2004 | Liebchen |
| 2006/0068301 A1 * | 3/2006 | Hirukawa ..................... 430/5 |
| 2006/0098195 A1 * | 5/2006 | Brill et al. ................ 356/326 |
| 2006/0126916 A1 * | 6/2006 | Kokumai ................... 382/151 |
| 2007/0035716 A1 | 2/2007 | Yoshi |
| 2007/0134940 A1 * | 6/2007 | Hirukawa ................ 438/780 |

* cited by examiner

70

80

METHOD OF SELECTING A SET OF ILLUMINATION CONDITIONS OF A LITHOGRAPHIC APPARATUS FOR OPTIMIZING AN INTEGRATED CIRCUIT PHYSICAL LAYOUT

FIELD

The invention relates to a method of selecting a set of illumination conditions of a lithographic apparatus, in a process for transferring an integrated circuit layout to a target substrate, the layout comprised of a number of polygon patterns having a predetermined geometrical relation relative to each other.

BACKGROUND

An integrated circuit has circuit functionality that is determined by the geometrical layout of its constituting complex circuit elements, formed as polygons or polygon structures, which are arranged in layered structures of various materials, such as polysilicon (poly), silicon dioxide, doped regions, dielectrics and metal regions. Examples of complex circuit elements are: FET (Field Effect Transistor), BJT (Bipolar Junction Transistor), diodes with various functional goals, resistor, inductor, capacitor, interconnect to connect various passive and active elements with desired goals and configuration etc. Further, any possible circuit configurations formed from combination of such elements from a single device such as a transistor to matched transistor pairs, transistors on critical timing paths, decoupling capacitor/coupling inductor to more complex configurations such as clock trees, sense amplifiers, IO drivers, row/column decoder of a memory, current mirrors, temperature sensor, PLL, DLL & whole memory arrays are considered complex circuit elements. In short, these elements have a recognized and predefined electrical function in an electrical circuit scheme, and thereby constitute the active and passive elements of the electrical circuits that are defined by the polygon structures. Generally, the circuit layout is provided as a mask layout of a mask element in a photolithographic apparatus. The mask layout can comprise geometric adaptations to optically correct for proximity effects which take place during optical transfer in the lithographic apparatus, for instance, by a lens system and/or projection system. These optical transfer systems have specific optical characteristics that can be tuned to provide an optimal setup of lithographic tunic parameters. The parameters may sometimes even be associated to a specific circuit layout requiring specific setup of the lithographic apparatus. In addition, the lithographic system has certain optical system deficiency characteristics (lens aberration etc) that can be accounted for in the optical proximity corrections carried out in the circuit layout.

Since the mask layout is often tuned to the specific lithographic system, it will result in printing difficulties when the illumination parameters are not carefully selected. This is especially true when a manufacturer chooses to change the lithographic systems. Accordingly, the objective is to select a set of illumination conditions in a lithographic apparatus, in a process for transferring a pattern to a target substrate, to an extent that acceptable transfer characteristics are achieved which will result limited production loss of malfunctioning circuits. Generally, throughout this text, by optimizing the illumination conditions it is sought to optimize lithographic process parameters relevant for obtaining correctly functioning integrated circuits, including but not limited to tuning parameters such as focus, dose, numerical aperture, sigma in, sigma out.

Calculating a cost number for specific illumination settings, which cost number can be optimized to optimize to a yield prediction value, can be seen as an advanced way of identifying illumination settings for a different production setup: if the cost number is too bad one may opt to modify the illumination settings to get better manufacturing yield.

One publication that deals with calculating a yield prediction value is U.S. Pat. No. 6,738,954. In this publication, a quality number calculation is performed on a proposed layout. A number of subdivisions of a circuit are assessed each resulting in an average fault number and a statistical error value of said fault number. Iteratively, a statistical error of the average number is reduced until the statistical error is below an error limit.

U.S. Pat. No. 7,013,441 is another publication that is concerned with calculating a predicted manufacturing yield from an integrated circuit. Here, by selecting library elements from a design database to include in a proposed design for the integrated circuit, a yield is calculated based on a normalization factor that is associated to the library element and used to account for a sensitivity of the library element to a given defect.

U.S. Pat. No. 7,245,356 concerns a method of configuring a transfer of an image of a patterning device pattern. A pattern, representative of an aggressive configuration included in the mask layout is selected to optimize the parameters of the lithographic apparatus. A simulation model is provided that simulates a transferred image, to identify a response of the illumination system for a number of individual source points, which results in a determination of an optimal illumination arrangement.

SUMMARY

It is desirable to provide a further optimization in a method of selecting a set of illumination conditions of a lithographic apparatus, in a process for transferring an integrated circuit layout to a target substrate. According to an aspect of the invention, there is provided a method according to claim 1. In particular, according to said aspect, there is provided a method including providing an initial set of illumination conditions; providing a plurality of polygon patterns requiring illumination conditions critical for circuit functionality; calculating for the initial set of illumination conditions a local cost number, defining a difference measure of at least one critical dimension between the polygon pattern and a transferred polygon pattern as a function of illumination condition; aggregating for each polygon pattern the cost numbers; and varying the illumination conditions so as to select an optimal set of illumination conditions having an optimized aggregated cost number. The method further comprises identifying polygon patterns as predefined complex circuit elements wherein the cost numbers are expressed as circuit element cost number functions that are individually associated with said identified complex circuit elements, so as to express circuit element design intent. In another aspect there is provided a system according to claim 12. The system comprises an input, an output and a processor arranged to perform the method of claim 1.

In yet another aspect, there is provided a method of selecting a set of illumination conditions of a lithographic apparatus, in a process for transferring an integrated circuit layout to a target substrate, the layout comprised of a number of polygon patterns having a predetermined geometrical relation relative to each other, the method comprising: providing an initial set of illumination conditions; providing a plurality of polygon patterns requiring illumination conditions critical for circuit functionality; calculating for the initial set of illumination conditions a local cost number, defining a difference measure of at least one critical dimension, between the polygon pattern and a transferred polygon pattern as a function of illumination condition; aggregating for each polygon pattern the cost numbers; and varying the illumination conditions so as to select an optimal set of illumination conditions having an optimized aggregated cost number, wherein the method further comprises: selecting a cost number function to have interdependencies in at least two critical dimensions of the polygon pattern, so as to express two dimensional pattern geometry.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
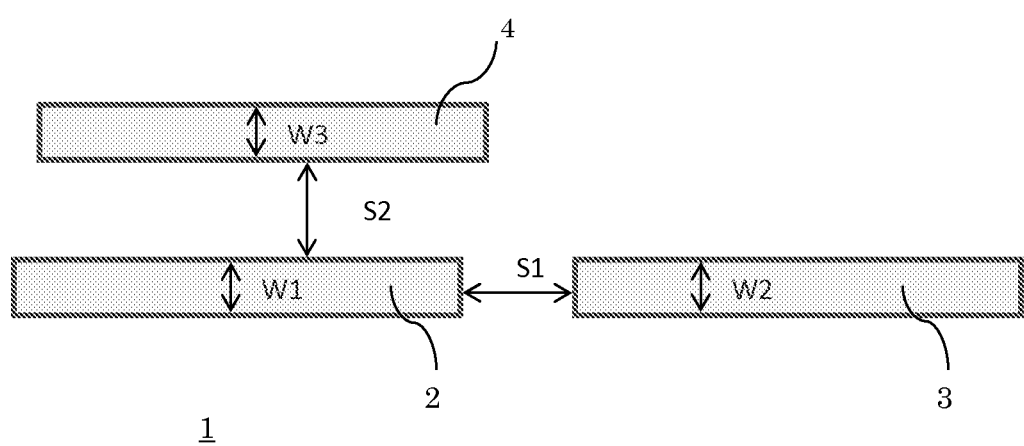
FIG. 1 illustrates schematically a critical area in a detail of an integrated circuit layout.

Referring to FIG. 1 there is shown schematically a layout detail 1 of polygons 2-4 in an integrated circuit. The detail comprises two adjacent metal tracks 2, 3. These tracks 2, 3 define space S1 which may be critical for providing an electrical connection, or electrical isolation, to provide correct electrical functioning. The polygon layout, for instance of the form as shown in FIG. 1, is to be transferred to the substrate using a lithographic apparatus. During transfer, transfer deficiencies may give rise to distortions, which will yield a difference between the printed dimensions, and the target dimensions. This is in particular the case when a layout is to be transferred on a different lithographic apparatus, or when a lithographic apparatus has aged or been altered over time. A selection of illumination conditions for optimal transfer is then desired. To this end, for any segment, a penalty is calculated for the deviation between the (simulated) printed CD (referenced as print_CD) with reference to the target drawn CD (referenced as target_CD). This is done using some cost function, which is then optimized. In this example, the goal would be to minimize the cost. An example implementation for cost on a single segment could be:

$$\text{cost} = (\text{print\_CD} - \text{target\_CD})^{**}2$$

CD here is defined as either a width of a segment or space between 2 segments, for example, S1 or any one of W1-W3 or S1, S2. If more than one of these parameters are considered critical, they may be added as additional terms in the cost function.

For a layout composed of several segments on a given design layer, the goal would be to minimize the total cost, for example as a sum of least squares.

Such cost functions can be used to model a wide variety of effects and can be generally seen as a quality number, for instance, for predicting a printing related yield (e.g. putting cost on bad contrast); random defect related yield (e.g. sensitivity to particles, or bad contacts); electrical properties (e.g. put cost on drain area's because it slows down circuit speed and increases dynamic power consumption); or mask making related cost (e.g. put cost on jogs in shape edges because it increases mask-fracture count, and mask writer time).

An integral quality number of this layout is therefore provided by this cost function, which may relate to an estimated yield loss as a simple aggregated number. To assist a user or an automatic optimisation tool in optimising the illumination conditions, according to an aspect of the invention, illumination or other lithographic conditions may be perturbed to evaluate a perturbed quality number of said perturbed layout; and layout perturbations are selected that optimize the quality number. Thus, in the present example, this amounts to finding a layout that has minimal total cost. Where in the example in FIG. 1 only a single layout detail (critical distance S1) is taken into account for the cost function (that is, a single "hotspot" wherein positioning of adjacent complex circuit elements influence the cost), generally, in a cost function, details of many "hot spots", that is, layout details where a cost problem may be expected, are taken into account to arrive at a total aggregated cost number.

Figure 2A:
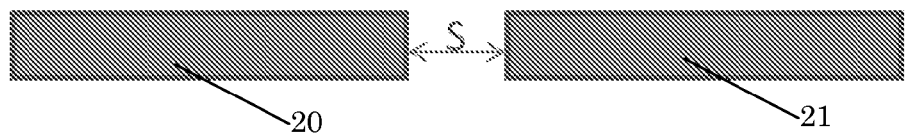
FIGS. 2-4 shows various examples of scanner optimizations using design intent.
Figure 2B:
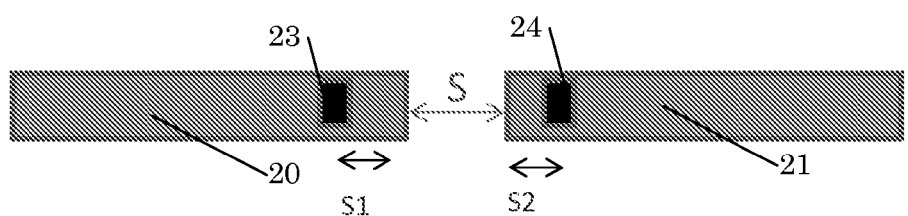
Figure 2C:
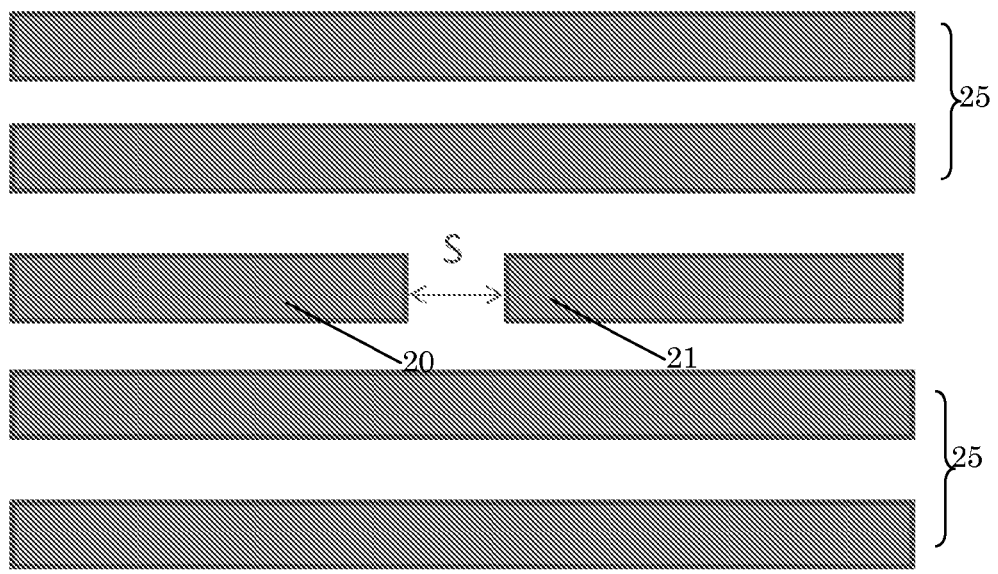

FIG. 2a-c shows various examples of scanner optimizations. In FIG. 2a a simple conventional optimization is sought, using a regular cost function that optimizes the space S between two poly segments according to: cost=(print_S-target_S)^2. However, in FIG. 2b, an additional aspect is introduced in the cost function, associated with a design aspect of the circuit. In this particular case, when the contacts 23-24 are shown with reference to polystructures 20-21, the contact overlap S1/S2 is maximized provided printed S is a non-zero minimal value. The goal would be to make sure that the contact lands fully on the poly to make a good contact.

One exemplary cost function for this is: cost=exp(S1min−S1)+exp(S2min−S2)+exp(Smin−S), where S1min=S2min is the minimum via overlap and Smin=minimum space to prevent shorts, and reflect pre-defined thresholds.

In FIG. 2c, yet another design or functional aspect can be associated to a cost function expressing the two dimensional embedding of the critical distance S: Here the cost function can then reflect that the space S is a function of not only the poly along the critical distance S but also of the poly pattern along a direction transverse to the critical distance. Indeed, the presence of additional poly elements 25 may influence the printability of the space S, which can be accounted for as a contribution of a cost factor from more than a single geometrical dimension.

Figure 3A:
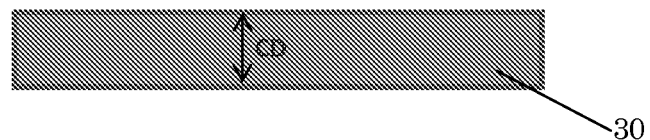
Figure 3B:
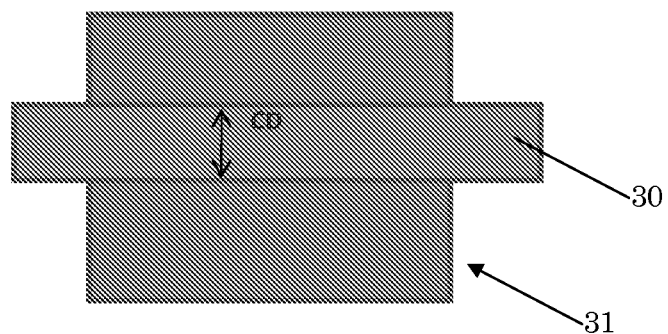
Figure 3C:
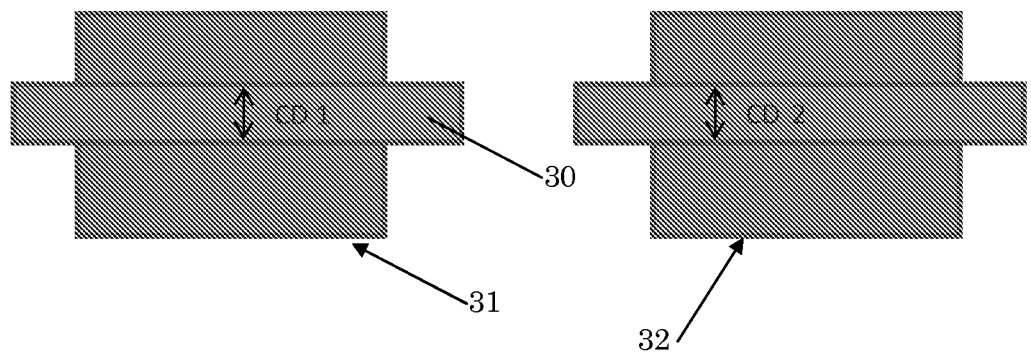

FIG. 3a-c show yet another example of optimization of illumination conditions, taking into account functional aspects of the hotspot patterns according to some pre-classified aspects. In particular, FIG. 3A merely shows a regular line 30 (which could be a metal line or a poly line without any additional layer information), having a critical width distance CD that can be optimized according to cost=(print_CD−target_CD)^2. However, the critical width distance may be calculated with a different cost function taking into account a pre-classified functional aspect of the circuit. In particular, it may be identified, for instance, via a layer recognition technique, that the poly CD represents a channel length of a transistor 31. For instance, the target design channel length CD of the transistor 31 can be optimized based on the design goal and functionality of transistor 31. Consequently, where the layout concerns a low power circuit, the CD can err on being larger; and accordingly, the cost can be defined as:

if print_CD>=target_CD,cost=(print_CD−target_CD)
      **2,else=infinite

Similarly if the layout concerns a high speed layout, the CD can err on being smaller and cost can be defined as:

if print_CD<=target_CD,cost=(print_CD−target_CD)
      **2,else=infinite

Furthermore, it may be identified that the transistor 31 is on a critical timing path, which might need to match the print CD to the target CD more critically than a quadratic contribution in order to predict the timing path as accurately as possible.

Consequently, its cost function could be defined as: cost=exp|(print_CD−target_CD)|

It is shown that in such a critical design configuration, the cost number function can be selected to change in other mathematical forms besides quadratic or other power series such as exponential.

Furthermore, with reference to FIG. 3c it may be identified through additional input that the CD's CD1 and CD2 are part of a pair of matched transistors 31, 32 such as in sense amplifier, current mirror or other critical analogue circuit configurations of matched transistors. Accordingly, the identification could associate a cost function to the optimization, which would be optimized such that the difference between the CD1 and CD2 is minimal with only a slight penalty attributed to a difference between print layout and target layout of respective critical distances CD1, CD2. So an example of a cost function could be:

Cost=exp|(print_CD1−print_CD2)|+(print_CD1−
      target_CD1)2+(print_CD2−target_CD2)2

It is shown that the cost can be expressed as a number of interdependent critical dimensions, wherein interdependency is expressed as an algebraic expression of cost factors including variables each influencing each other to some degree. This can also be expressed as a statistical correlation if desired. Interdependency may be identified by a non zero derivative of the cost function in more than one geometrical dimensions to express pattern design intent and/or two dimensional pattern geometry.

As an example of identifying polygon patterns as predefined complex circuit elements the examples of FIGS. 3A-C show that polygon patterns 30-32 can be matched against a predefined set of complex circuit elements, and a cost number function can be selected for each polygon pattern relative to a matched circuit element to account for a designed element functionality. Typically, this process involves identifying polygon patterns as predefined complex circuit elements and expressing a cost number as a circuit element cost number functions that is individually associated with said identified complex circuit elements, so as to express circuit design intent.

This design intent can be extracted using existing layers and/or an additional input layer which can be regarded as a complex circuit element indicator layer indicating complex circuit elements in the polygon patterns. The circuit element cost number functions are calculated based on said complex circuit element indicator layer. (see FIG. 12, input 1211) Alternatively, fuzzy pattern matching can be used in the circuit layout analysis expressing design intent. More generally, the complex circuit element cost functions can be formed based on any information that can be extracted from layout or that can be given in addition to layout that concerns an interpretation to their electrical function or purpose. Specifically, such complex circuit element information differs from simple width/space/topology knowledge that can be extracted from a set of polygons without an interpretation on their purpose.

As an example, such information might be determining the presence of a polygon pattern in a stacked layer configuration, which can be assessed, typically, by a boolean evaluation: and/or/and not between any set of layers.

Figure 4A:
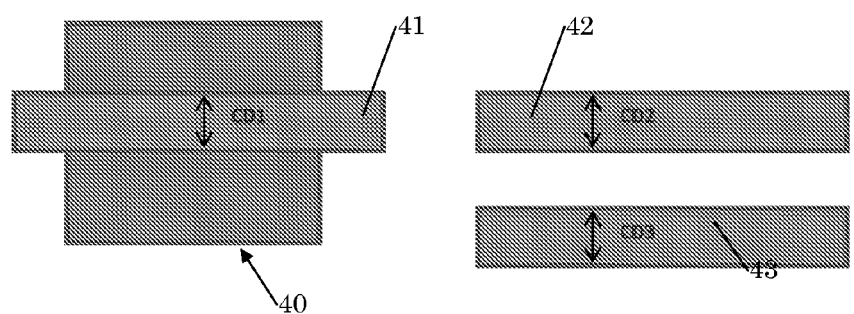

See for instance the structures of FIG. 4a. The overlap (Boolean AND) of layers 40 and 41 is used to identify the functional element as transistor gate. In this way the polygon pattern can be identified as a functional element of a complex circuit element. In addition, the size of the polygons in a polygon pattern can be assessed to derive a complex circuit element function.

As another example, selections of cost functions can be based on: presence of text label, connectivity, interaction with other shapes (in whatever layer), shape properties such as (but not limited: area, #points, max/min width/height, corner types (inward/outward)))

Figure 4B:
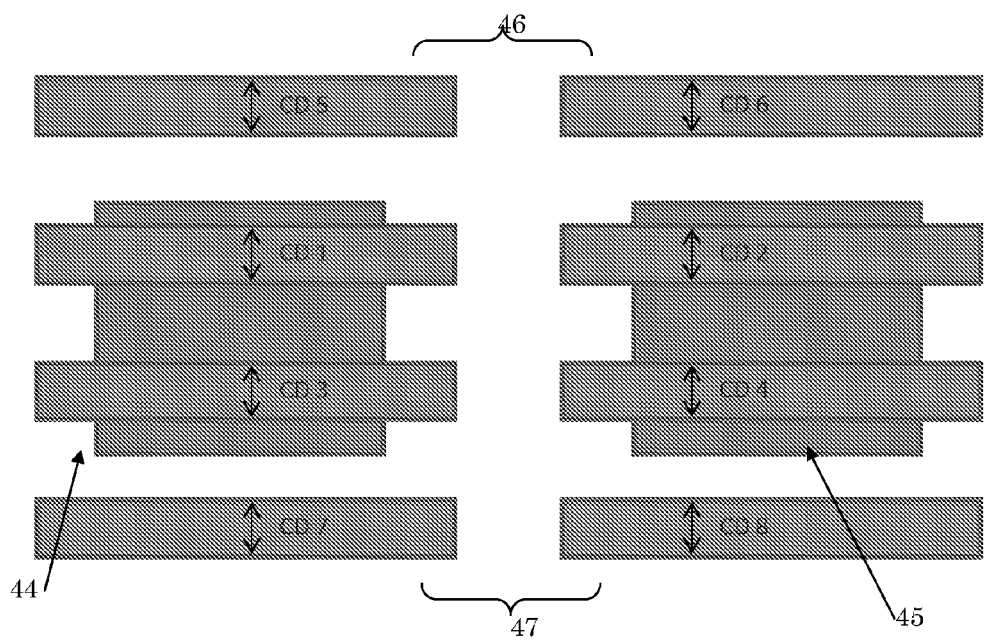

FIGS. 4a and 4b give yet another example, where a functional aspect of the circuit layout is expressed as a cost penalty in the cost function which is sought to be optimized. This functional aspect is reflected in the choice of a particular cost function. Taking only into account an optimal transfer, without taking into account the functional aspects of the circuit, a cost in a layout of FIG. 4a would be the uncorrelated sum of individual costs attributed to the critical distances CD1, CD2, and CD3 of polygons 41-43. However, assuming that CD1, which is a CD of a transistor 41, needs to be optimized on a critical timing path and CD2 and CD3 are optimized just as poly segments 41, 42, then a cost function could be expressed as:

total COST=exp|(print_CD1−target_CD1)|+
      (print_CD2−target_CD2)**2+(print_CD3−tar-
      get_CD3)**2

This is similar to the FIG. 4b example, where in the conventional optimization, all poly CD's will be optimized independently and cost will be expressed as a sum of cost_i= (print_CD_i−target_CD_i)**2, for all i (1-8).

However, if an active layer is present, CD1-CD4 may be identified as part of transistors 44, 45, where CD5-CD8 may deviate significantly as they represent dummy features 46, 47. Which may result in a modified cost function of cost_i= (print_CD_i−target_CD_i)2, for i (1-4)—leaving out the contributions of the dummy polygons 46, 47**. It is shown, that element design intent can be expressed in the local cost function by having a constant (zero) contribution of selected polygon patterns.

In the previous examples, it is shown that a plurality of polygon patterns 40-47 can be provided requiring illumination conditions critical for circuit functionality; wherein a cost number function is adapted in relation to circuit element functionality that is associated with the polygon areas 40-47. Accordingly, element design intent can be expressed in the local cost function. Alternatively, from a regular mask layout pattern to be transferred, predetermined polygon areas may be selected as hotspot regions identified in the mask layout pattern. This is further explained by the flow in FIG. 5. Steps are as follows:

1. Analyze the mask layout to find areas that are potentially problematic to print and process. The result of this step is a number of layout patterns that can be used to assess printing quality. The main reason for this step is to a have more efficient operation: the total mask layout can be over 100 Gb in size which is impossible to handle during optimization. The resulting patterns, hotspot clips, are much smaller data. For example, 1K to 1M (potential) hotspots can be found of for instance 2×2 micron. This would then result in 1 Mb to 1 Gb of hotspot data.

2. On the database of layout clips (see FIG. 12) the optimization is run. Effectively for varying printing setup, the clips are being analyzed for the printing yield. The outcome is the setup with best result.

3. Final step is a verification step. With the litho setup as found in step 2, simulation and hotspot detection is ran over the full layout. When no hotspots are found the job finishes, otherwise additional layout clips are added (step 4) to the hotspot database and step 2 is repeated. Finally all hotspots are processed and final optimal illumination conditions can be derived (step 5).

Figure 5:
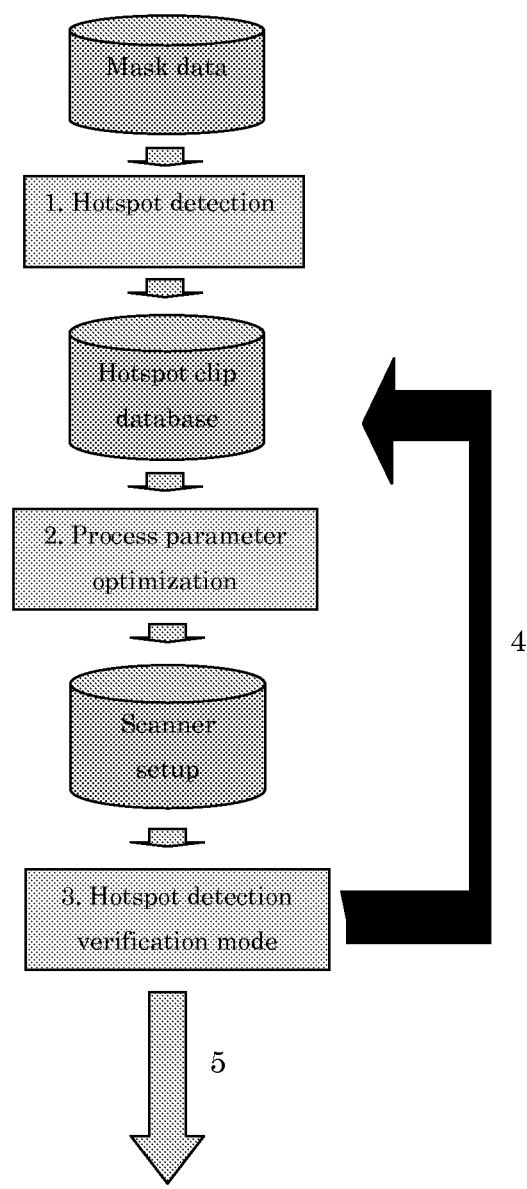
FIG. 5 shows an example flow of an optimization scheme.

In addition, as illustrated in step 3 of FIG. 5, cost function analysis is done for all clips in the hotspot clip database. Two modes can be distinguished:

1. Independent rating of all hotspot clips. All the clips produce a scoring number and these will simply be added. Optimization will try to minimize the total number. This rating is good for independent failure mechanisms.

2. Concurrent rating of the clips. The independent rating method does not account for the systematic nature of printing related yield loss. For instance if one hotspot has acceptable dose range from −1% to +20% it can have a good score according to mode #1. Same holds for a hotspot with range −20% to +1%. So in method #1 this would be an acceptable combination, but effectively the dose range for the two clips is −1% to +1% which is not good. To account for this, in the concurrent rating we assume that the clip analysis produces a set of ranges for statistically independent process variation parameters (like dose, focus) in which the layout prints OK according to the acceptable limits (e.g. for CD variation) which are checked in yield assessment functions. When optimizing, the overlap of all ranges for all the hotspots is determined, and this overlap (weighted for the different variation parameters) is optimized.

Thus, a method is illustrated comprising selecting a plurality of hotspot regions in the integrated circuit layout so as to provide the polygon patterns as a selected number of hotspot regions, the hotspot regions requiring illumination conditions critical for circuit functionality and ranked according to a criticality measure. A rating of the clips can be done according to the examples in FIGS. 2-4.

Figure 6:
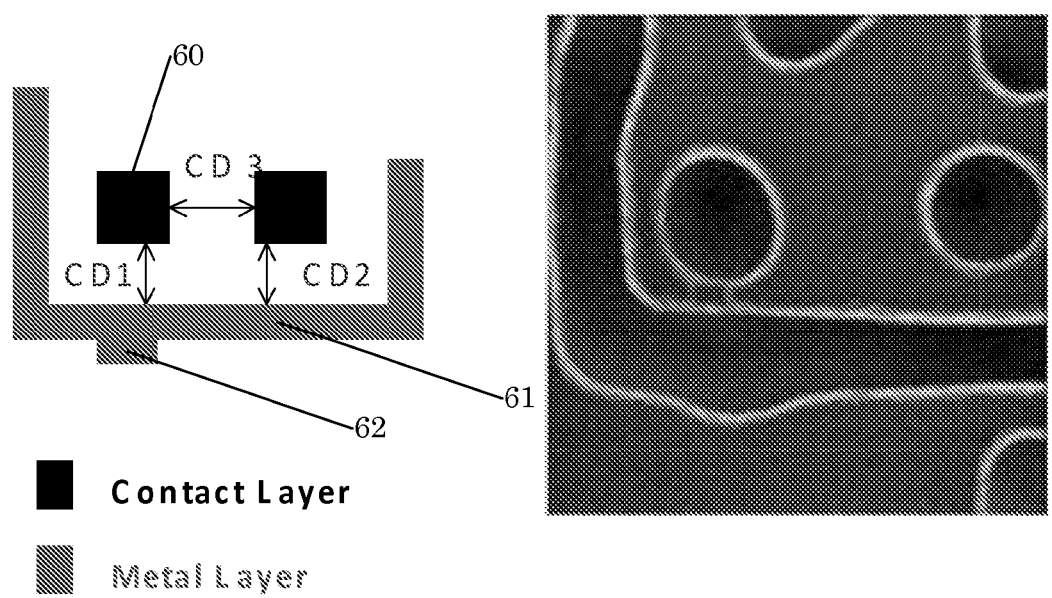
FIG. 6 shows the effect of a proximal polygon structure.

FIG. 6 shows an electron microscope image 60 of a circuit 61, which shows a risk of shorts without adapting the cost function due to the effect of proximal polygon structures. As shown in the corresponding image, the contact 60 on left short circuits to the metal line 61 (CD1 could be sub-minimal) because of the proximity of the landing tab 62 to the contact 60.

The cost function for this configuration can be selected to account for the optical proximity effect of a proximal geometrical pattern 61, 62. In an aspect the invention concerns the selection of a cost function which accounts for the two dimensional geometry of a hotspot pattern, so as to control optical proximity distortions.

Figure 7:
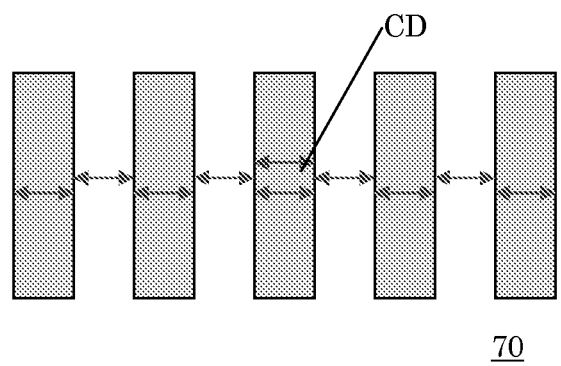
FIG. 7 shows a conventional single dimensional variation of a grid pattern.

FIG. 7 shows a conventional single dimensional variation of a grid pattern 70. In particular, in the grid pattern 70, the pitch is varied between 130, 150, 170 and 300 nm and a width variation of the critical dimension is varied between 40, 50 and 60 nm. A cumulative cost function is calculated for this set of patterns, which is defined (for each pattern) as (print_CD−target_CD)^2.

Figure 8:
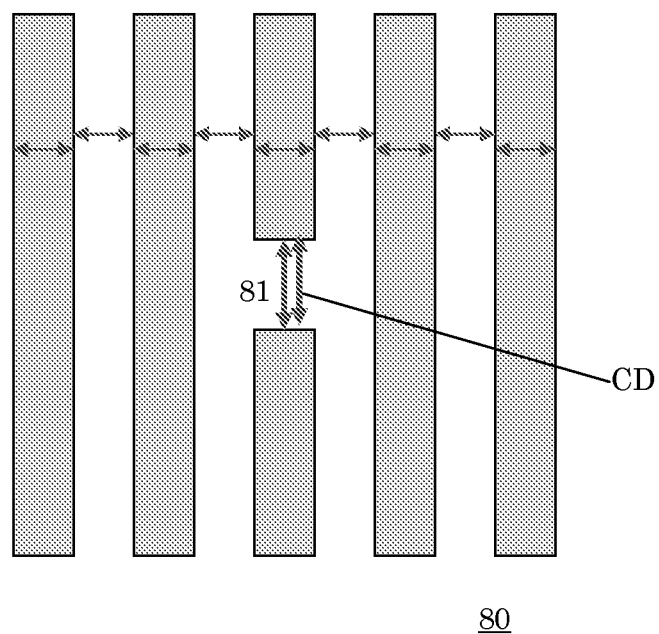
FIGS. 8-10 show a multidimensional geometrical variation of a grid pattern.
Figure 9:
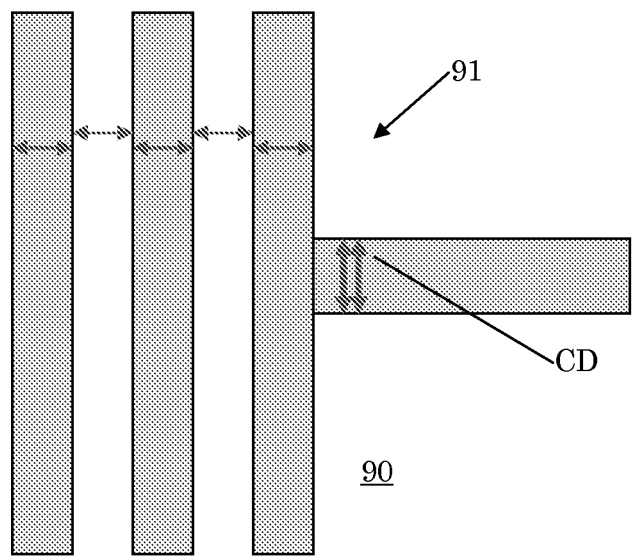
Figure 10:
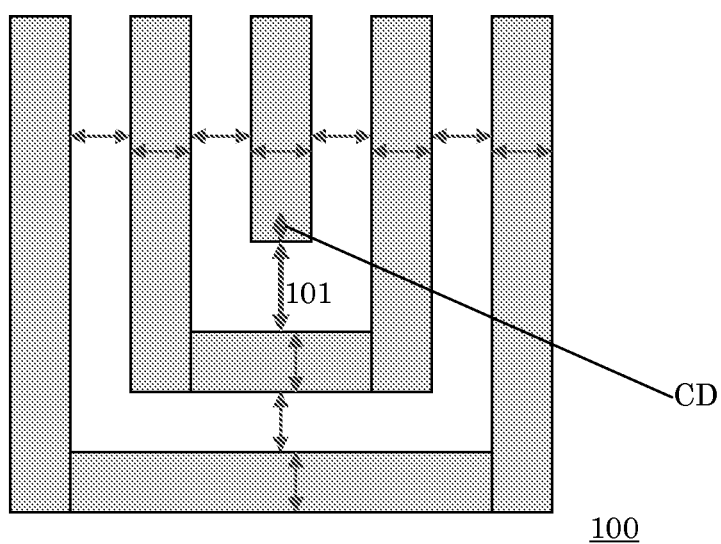

FIG. 8-FIG. 10 shows a number of polygon patterns 80-100 that may be identified in an integrated circuit layout. The polygon patterns may comprise critical dimensions indicated as CD for which correct image transfer is critical for circuit functionality and which may constitute hotspots in a generic circuit layout potentially affecting the circuit functionality. In addition to the single dimensional variation of the grid pattern, a line end space 81 variation in the orthogonal direction was applied in FIG. 8 of 90, 90, 100 and 120 nm. In FIG. 9, in addition to linear pitch and width variation, a T configuration 91 was applied having a width variation. In FIG. 10, another line-end variation 101 was applied.

This results in additional patterns, wherein local proximity effects may affect transfer of the critical dimension, and which may contribute to a cost function to be minimized.

As an exemplary embodiment, a hotspot may be identified when one of the following conditions is met in conventional C-programming notation:

Too small space. At sample points space may not be below 75 nm $$\text{Cost}=s>75\text{ nm}?0:(s-75\text{ nm})^2$$

Too small width. At sample points width may not be below 40 nm $$\text{Cost}=w>40\text{ nm}?0:(s-40\text{ nm})^2$$

Too small via cover margin (assuming pattern is metal that should overlap contact or via). At sample points margin may not be below −5 nm $$\text{Cost}=m>-5\text{ nm}?0:(m+5\text{ nm})^2$$

It is shown that in this example, the cost functions may be expressed as discontinuous functions, to express element geometry in the local cost function.

Comparative simulated printing results between the conventional selection and the new selection results are shown in FIG. 10. Specifically, in a comparative example illumination conditions were sought for a target scanner, where the original scanner operated with a numerical aperture of 1.3, an approximate Sigma-in of 0.55; an approx sigma-out of 0.85 and a threshold of 0.34. Other lithographic apparatus tuning parameters may include resist processing parameters such as bake time and resist development time.

Accordingly, a number of illumination parameters of a target scanner were stepwise varied according to Table 1 below, yielding a total of 5*9*9*9=3645 conditions in a standard grid search:

TABLE 1

|  | min | max | step |
| --- | --- | --- | --- |
| NA | 1.15 | 1.35 | 0.05 |
| Threshold | 0.31 | 0.39 | 0.01 |
| Sigma in | 0.45 | 0.65 | 0.025 |
| Sigma out | 0.75 | 0.95 | 0.025 |

It was assumed that no further aberrations were present in the optical system and illumination system.

Optimization using 1-D variation without using Design Intent and 2-D variations; equivalent 2-D rank of this optimized condition not in top-10 of Table 3.

TABLE 2

| 2-D rank | NA | Sigma In | Sigma out | Threshold | 2-D score | 1-D stdev |
|---|---|---|---|---|---|---|
| >10 | 1.3 | 0.5 | 0.95 | 0.33 | 243.5 | 32.6 |
| >10 | 1.3 | 0.525 | 0.925 | 0.34 | 130.86 | 35.2 |
| >10 | 1.25 | 0.525 | 0.85 | 0.34 | 545.945 | 45.2 |
| 2 | 1.3 | 0.55 | 0.9 | 0.35 | 93.59 | 50.9 |
| >10 | 1.3 | 0.525 | 0.95 | 0.34 | 199.46 | 51 |
| 1 | 1.3 | 0.55 | 0.875 | 0.35 | 83.04 | 51.6 |
| >10 | 1.25 | 0.525 | 0.875 | 0.34 | 553.84 | 52.7 |
| >10 | 1.3 | 0.525 | 0.9 | 0.34 | 147.41 | 58.7 |
| >10 | 1.25 | 0.55 | 0.85 | 0.35 | 240.19 | 59.5 |
| 5 | 1.25 | 0.525 | 0.9 | 0.35 | 108.8 | 60.5 |

Optimization with Design Intent and 2-D variations; equivalent 1-D rank of this optimized condition equals rank 6 in Table 2.

TABLE 3

| 1-D Rank | NA | Sigma In | Sigma out | Threshold | 2-D score | 1-D stdev |
|---|---|---|---|---|---|---|
| 6 | 1.3 | 0.55 | 0.875 | 0.35 | 83.04 | 51.6 |
| 5 | 1.3 | 0.55 | 0.9 | 0.35 | 93.59 | 50.9 |
| >10 | 1.3 | 0.575 | 0.85 | 0.36 | 94.325 | 71.7 |
| >10 | 1.3 | 0.575 | 0.875 | 0.36 | 94.79 | 62.1 |
| 10 | 1.25 | 0.525 | 0.9 | 0.35 | 108.8 | 60.5 |
| >10 | 1.3 | 0.65 | 0.95 | 0.33 | 116.51 | 237.25 |
| >10 | 1.3 | 0.625 | 0.95 | 0.33 | 118.27 | 253.35 |
| >10 | 1.25 | 0.525 | 0.875 | 0.35 | 128.16 | 83.2 |
| >10 | 1.35 | 0.65 | 0.9 | 0.33 | 128.37 | 294.65 |
| >10 | 1.3 | 0.55 | 0.85 | 0.35 | 128.52 | 61 |

Figure 11:
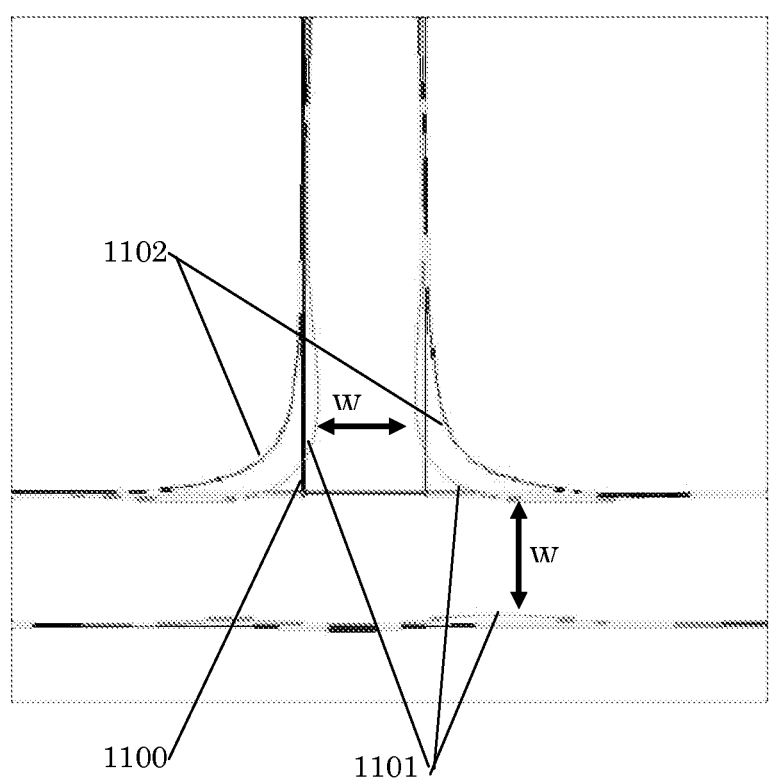
FIG. 11 shows resulting printing contours of a comparative example.

The resulting printing contours are shown in FIG. 11, wherein the optimum contour 1101 for a T-shaped target 1100 is shown, selected according to the 1D method, against the optimum contour 1102, selected according to the 2D method is shown. It shows in FIG. 11 that the 1D contour 1101 yields minimal width dimensions W that may affect circuit functionality.

Accordingly, comparative results indicate:

1-D OPE matching and 2-D matching select different scanner parameters

Best 1-D parameters results in 2-D layouts that print bad, and these layouts have very reduced process window Best 2-D parameters avoids printing problems and have better process window Best 2-D parameters give more CD-variation for 1-D pattern but increase of max CD error is limited (2.3 nm→2.6 nm)

Figure 12:
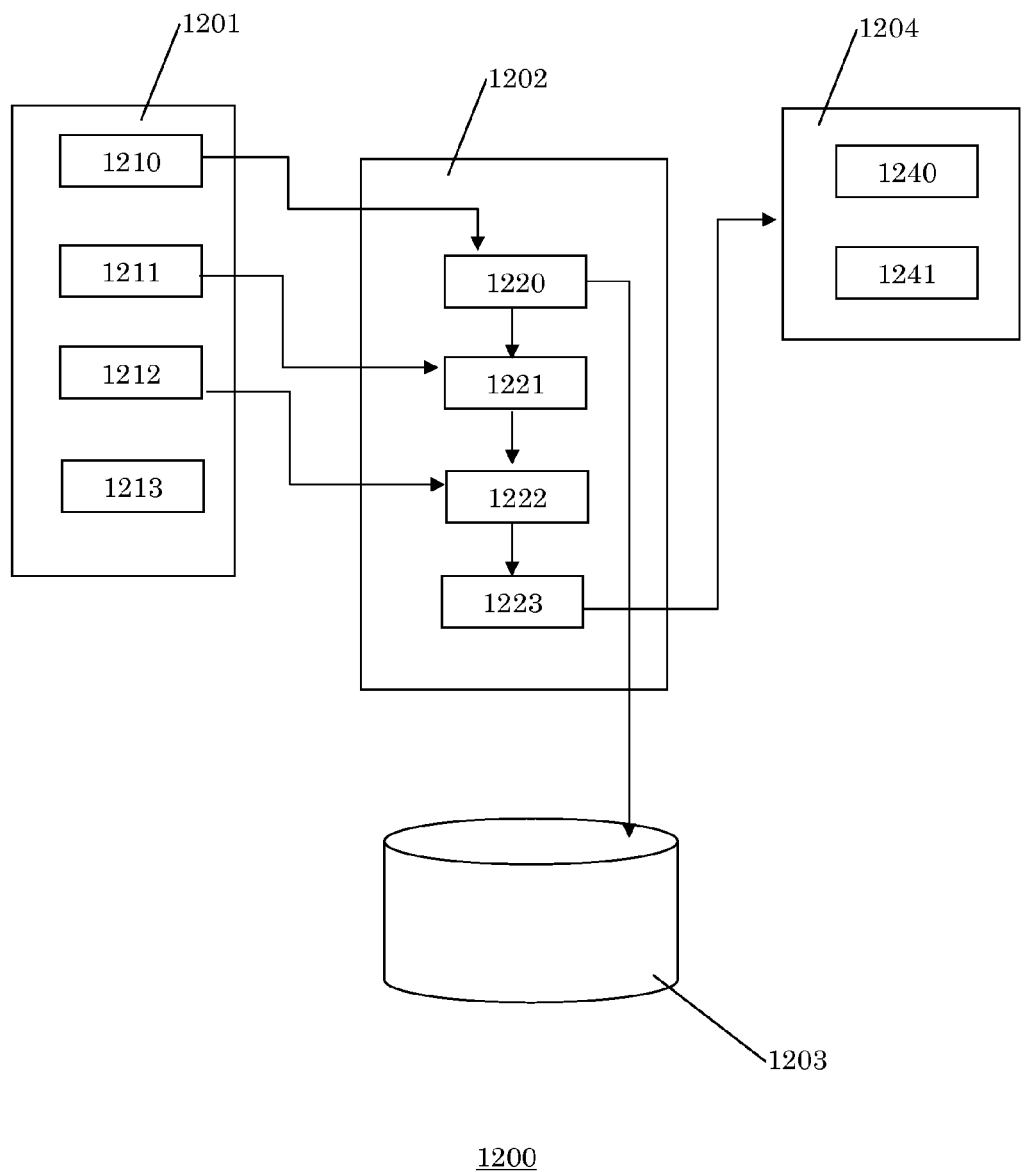
FIG. 12 shows a schematic illustration of a system according to an aspect of the invention.

With 1-D matching most CD's match better, but apparently worst-case is not much different FIG. 12 shows a setup of a system 1200 for selecting a set of illumination conditions of a lithographic apparatus for an integrated circuit layout to be transferred to a target substrate illustrating a schematic illustrative data flow. The system comprises an input 1201, a processing part 1202, a database 1203 and an output 1204.

Specifically, the input 1201 may non-limitatively concern the following functional entries.

Mask layout input 1210: a full layout of a mask for which optimized scanner settings have to be found.

Design layout data input 1211 for the layer for which the optimization is ran. This input is optional and can be regarded as a complex circuit element indicator layer, indicating the presence of predefined types of complex circuit elements. This data layer may be used when cost functions are defined as explained in the FIGS. 2-4, where additional design information can be included when selecting a cost function. In addition, design layout data of layers annex to layer for which the optimization is run may be included.

Simulated contour input 1212 according to original (not optimized) setup. This input may be used when yield functions are present that match target printing against original printing.

SEM image input 1313. For some locations SEM images can be present and for these locations the CD matching may be done.

Furthermore, the processing part 1202 may comprise the following functional processing circuits:

detection circuitry 1220 to detect a plurality of hotspot regions in the integrated circuit layout inputted from data input 1210. The detection is optional, alternatively, a single or plural predefined hotspot areas may be entered;

a selection circuit 1221 to select a cost number function adapted to the polygon pattern. The selection may be done by input processing of the design layout data received from input 1211. Alternatively, the system 1200 may be arranged to receive adapted cost functions from external input.

a calculation circuit 1222 to calculate the aggregated cost numbers for the polygon patterns; and an optimizing circuit 1223 set of illumination conditions having an optimized aggregated cost number. The optimizing circuit functions as explained in detail in FIG. 5.

The hotspot regions may be stored in a hotspot clipping database 1203 for further use in the processing, and for easy access in the optimization process and for outputting. To this end, the system comprises an output 1204, for example, in the form of an output data file 1240 in combination with a GUI 1241. The output 1204 is arranged to list a limited number of hotspots that contribute most to the resulting cost score; a breakdown of the total score into yield loss categories (as defined by the yield assessment functions) and the hotspots that contribute most there; and General optimization info like runtimes, job distribution, optimization progress, scoring values for start/intermediate/final results etc.

In the invention it is not relevant how the actual global optimisation is done, the concern is on how to prepare cost functions for proper trade off, and proper computation. Actual optimisation can for instance be done by linear programming (if the cost functions are convex and piece wise linear), integer linear programming (if cost functions are piece wise linear but not convex), genetic algorithms or simulated annealing (if cost functions are ill shaped) etc.

Furthermore, the optimization can be carried out for various circuit layout structures, including polysilicon structures, metal structures or active regions areas including doped materials. For example, for metal structures, when these are identified to belong to symmetrical segments of a clock tree, they will be optimized identically with high priority assigned to minimizing the delta between their CDs. Note that such could be located quite a distance apart from each other and yet be part of the same clock-tree.

Furthermore, when it's known that the segment is part of a critical timing arc, and the delay through the segment needs to be known precisely, the delta in the CD relating to the width of the metal line (as well as space from any neighbouring lines), from the target layout could be related to timing net slack information in ps.

For example, if the acceptable timing slack can be 5 ps, then the delta in CD can be x nm, while if it is 10 ps, the delta in CD could be y nm. Similarly for meeting a smaller timing slack, the space to any neighbouring line could be optimized. If the location of the via is also known for the same segment which is part of critical timing arc, then the via overlap S is optimized to result in a tighter spec for via resistance. If there are multiple vias present, then the overlap S could be optimized with a less stringent resistance spec for a single via.

As a further example the cost function can be adapted according to circuit functionality, for instance, when it's known that a signal line is flanked by aggressor lines, which cause AC coupling. If the circuit is designed such that the AC coupling from such aggressor lines are supposed to be equal, then it's advantageous that the widths of their lines and their spaces to the signal line are optimized to the same exact tolerance. If on the other hand, the flanking lines of a signal line are not aggressor lines but static shield lines such optimization can be left out.

In some aspects, the method can be characterized as a method of selecting a set of illumination conditions of a lithographic apparatus, in a process for transferring an integrated circuit layout pattern to a target substrate, the layout comprised of a number of polygons having a predetermined geometrical relation relative to each other, the method comprising: providing an initial set of illumination conditions and providing the integrated circuit layout; identifying at least one hotspot region in the integrated circuit layout; the hotspot region requiring illumination conditions critical for circuit functionality; assessing, for the initial set of illumination conditions, in the hotspot region, a local cost number, expressing a difference measure between the hotspot region and a transferred hotspot region as a function of hotspot geometry and illumination condition; perturbing said cost number by varying said set of illumination conditions; and selecting perturbations of said illumination conditions that optimize the cost number, so as to select an optimal set of illumination conditions, wherein the cost number is expressed as cost functions that are classified according to predetermined classes associated with a predetermined hotspot circuit functionality. The hotspot circuit functionality may be determined by matching the hotspot geometry against a set of predetermined functional circuit structures.

In the figures, a focus is given on cost function analysis wherein best match physical characteristics are evaluated that include geometrical characteristics of said circuit layout, in particular, by storing corner and edge coordinates of polygons. However, cost function may also include non-geometrical parameters, such as material composition ratio's or the like. Furthermore, the cost function analysis not only focuses on two-dimensional variations of layout components, but may also concern height variations. In particular, this is of interest in providing accurate prediction of metal height variations as induced by chemical mechanical polishing or providing or providing dummy 3D structures to mitigate variation due to chemical mechanical polishing of the metal/dielectric system. In general, the cost functions, or quality numbers, may concern any aspect that is considered of relevance to a layout optimization, including but not limited thereto printing related predicted yield; a random defect related predicted yield; a predicted electrical circuit performance value, in particular, circuit speed and/or power consumption; a mask making related cost; a random defect sensitivity, a quality of vias connecting multiple conducting layers in the design, a quality of electrical elements in the circuit layout, and/or a electro-migration sensitivity. Furthermore, not only the optimum analysis of these aspects may be of interest, but also robustness analysis of the selected optima. The latter aspect may include higher order differential analysis of the cost functions.

The skilled artisan will appreciate that, in the context of this description, the use of the term "critical area" refers to an area to be inspected for defects, in particular, an area which provides correct electrical functioning in terms of providing an electrical connection or an electrical isolation and is formed by adjacent edges and a common run length. Hence, critical areas are defined by polygons areas that make up a layout detail of an integrated circuit or spaces between such polygons. Polygons, throughout the application, refer to entities in the forms of polygons, used to define physical entities on a substrate, that in combination provide and define the functioning of a (micro) electric circuit.

The terms "perturbing", "pertubation" etc. are used in its standard mathematical meaning but also may concern small variations, in particular, step variations in illumination settings.

While specific embodiments of the invention have been described above, it will be appreciated that the invention may be practiced otherwise than as described. In particular, the descriptions above are intended to be illustrative, not limiting. Thus, it will be apparent to one skilled in the art that modifications may be made to the invention as described without departing from the scope of the claims set out below.

The invention claimed is:

1. A method of selecting a set of illumination conditions of a lithographic apparatus, in a process for transferring an integrated circuit layout to a target substrate, the layout comprised of a number of polygon patterns having a predetermined geometrical relation relative to each other, the method comprising:
providing, with a processor, an initial set of illumination conditions;
providing a plurality of polygon patterns requiring illumination conditions critical for circuit functionality;
calculating for the initial set of illumination conditions a local cost number, defining a difference measure of at least one critical dimension, between the polygon pattern and a transferred polygon pattern as a function of illumination condition;
aggregating for each polygon pattern the cost numbers; and
varying the illumination conditions so as to select an optimal set of illumination conditions having an optimized aggregated cost number,
wherein the method further comprises:
identifying polygon patterns as predefined complex circuit elements and wherein the cost numbers are expressed as circuit element cost number functions that are individually associated with said identified complex circuit elements, so as to express circuit design intent.

2. The method according to claim 1, further comprising selecting a plurality of hotspot regions in the integrated circuit layout so as to provide the polygon patterns as a selected number of hotspot regions, the hotspot regions requiring illumination conditions critical for circuit functionality and ranked according to a criticality measure.

3. The method according to claim 1, further comprising matching the polygon patterns against a predefined set of circuit elements, and selecting for each polygon pattern a cost number function relative to a matched circuit element.

4. The method according to claim 3, wherein the matching includes determining the presence of the polygon pattern in a predefined stacked layer configuration.

5. The method according to claim 1, wherein the plurality of polygon patterns are provided associated with a complex circuit element indicator layer indicating complex circuit elements in the polygon patterns; and wherein the circuit element cost number functions are calculated based on said complex circuit element indicator layer.

6. The method according to claim 1, wherein the cost number function increases more than quadratically when a polygon pattern is transferred outside a predetermined target region.

7. The method according to claim 1, wherein the cost number function is constant when a polygon pattern is transferred within a predetermined geometrical region.

8. The method according to claim 1, wherein the cost number functions are exponential functions and/or discontinuous functions.

9. The method according to claim 1, wherein said cost number represents a printing related predicted yield; a random defect related predicted yield; a predicted electrical circuit performance value; a random defect sensitivity, a quality of vias connecting multiple conducting layers in the design, a quality of electrical elements in the circuit layout, and/or a electro-migration sensitivity.

10. The method according to claim 1, wherein said integrated circuit layout pattern is provided by storing corner and edge coordinates of polygons representing the shapes of a local pattern.

11. An article of manufacture comprising a non-transitory computer usable medium having encoded thereon a set of instructions executable by a computer system to perform one or more operations, the set of instructions comprising:

instructions for providing an initial set of illumination conditions;

instructions for providing a plurality of polygon patterns requiring illumination conditions critical for circuit functionality;

instructions for calculating for the initial set of illumination conditions a local cost number, defining a difference measure of at least one critical dimension, between the polygon pattern and a transferred polygon pattern as a function of illumination condition;

instructions for aggregating for each polygon pattern the cost numbers; and instructions for varying the illumination conditions so as to select an optimal set of illumination conditions having an optimized aggregated cost number, and instructions for identifying polygon patterns as predefined complex circuit elements and wherein the cost numbers are expressed as circuit element cost number functions that are individually associated with said identified complex circuit elements, so as to express circuit design intent.

* * * * *

UNITED STATES PATENT AND TRADEMARK OFFICE
CERTIFICATE OF CORRECTION

PATENT NO. : 8,621,401 B2  Page 1 of 1
APPLICATION NO. : 13/143794
DATED : December 31, 2013
INVENTOR(S) : Berkens et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 47 days.

Signed and Sealed this
Twenty-second Day of September, 2015

Michelle K. Lee
*Director of the United States Patent and Trademark Office*